US006447938B1

(12) United States Patent
Bianchi

(10) Patent No.: US 6,447,938 B1
(45) Date of Patent: Sep. 10, 2002

(54) GALLIUM NITRIDE COLLECTOR GRID SOLAR CELL

(75) Inventor: Maurice P. Bianchi, Palos Verdes Estates, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/632,323

(22) Filed: Aug. 4, 2000

Related U.S. Application Data

(63) Continuation-in-part of application No. 08/798,349, filed on Feb. 11, 1997, now Pat. No. 6,103,604.

(51) Int. Cl.$^7$ ................................................. B32B 9/00
(52) U.S. Cl. ........................ 428/698; 428/212; 428/697; 428/699
(58) Field of Search ................................ 428/697, 698, 428/699, 212

(56) References Cited

U.S. PATENT DOCUMENTS

| | | | |
|---|---|---|---|
| 4,408,217 A | * 10/1983 | Kobayashi et al. | |
| 4,862,471 A | * 8/1989 | Pankove | 372/45 |
| 5,677,538 A | * 10/1997 | Moustakas et al. | 250/370.12 |
| 5,679,152 A | * 10/1997 | Tischler et al. | 117/97 |
| 5,727,008 A | * 3/1998 | Koga | 372/43 |
| 5,742,628 A | * 4/1998 | Fujii | 372/45 |
| 5,751,013 A | * 5/1998 | Kidoguchi et al. | 247/44 |
| 5,764,673 A | * 6/1998 | Kawazu et al. | 372/45 |
| 5,786,603 A | * 7/1998 | Rennie et al. | 257/13 |

* cited by examiner

*Primary Examiner*—Archene Turner
(74) *Attorney, Agent, or Firm*—Katten Muchin Zavis Rosenman

(57) ABSTRACT

A transparent conductive coating (TCC) formed from gallium nitride GaN on a sapphire substrate. In order to account for the lattice mismatch between the GaN and the sapphire substrate, a nucleation layer is formed on the sapphire substrate. A mask, for example, silicon dioxide $SiO_2$, is formed on top of the nucleation layer with a plurality of openings. GaN is grown through the openings in the mask to form a lateral epitaxial overgrowth layer upon which defect-free GaN is grown. The lateral epitaxial overgrowth compensates for the lattice mismatch between the sapphire substrate and the GaN. The use of a sapphire substrate eliminates the need for a cover glass and also significantly reduces the cost of the TCC, since such sapphire substrates are about ⅐ the cost of germanium substrates. The TCC may then be disposed on a GaAs solar cell. In order to compensate for the lattice mismatches between the GaAs and the GaN, an indium gallium phosphate InGaP may be disposed between the GaAs solar cell and the GaN TCC to compensate for the lattice mismatch between the GaN and the GaAs. In order to further compensate for the lattice mismatch between the GaN and InGaP, the interface may be formed as a super lattice or as a graded layer. Alternatively, the interface between the GaN and the InGaP may be formed by the offset method or by wafer fusion. The TCC, in accordance with the present invention, is able to compensate for the lattice mismatches at the interfaces of the TCC while eliminating the need for a cover glass and a relatively expensive germanium substrate.

10 Claims, 3 Drawing Sheets

GALLIUM NITRIDE COLLECTOR GRID SOLAR CELL

CROSS-REFERENCE TO RELATED APPLICATIONS

This application is a continuation-in-part of commonly-owned patent application Ser. No. 08/798,349, filed on Feb. 11, 1997 now U.S. Pat. No. 6,103,604.

BACKGROUND OF THE INVENTION

1. Field of the Invention

The present invention relates to a transparent conductive coating (TCC) and more particularly to a TCC formed from bulk gallium nitride GaN on a sapphire substrate that is configured to compensate for lattice mismatches at its interfaces, for example, the interface between the GaN and a sapphire substrate and the interface between the GaN and a solar cell.

2. Description of the Prior Art

Various opto-electronic devices require transparent electrical conductors that are conductive in the frequency range from DC to radio frequency (RF) and transparent to visible light. Such transparent electrical conductors are known to be applied to such opto-electronic devices in the form of a coating, and have become known as transparent conductive coating (TCC) materials.

Various applications of such TCC materials are known. For example, such TCC materials are known to be used for electrically resistive heating systems for aircraft windshields, as well as in satellite applications. Solar cells are also known to use such TCC materials. In particular, in solar cells applications, the TCC material is used for conducting solar photon-generated currents from the surface of the solar cells, without causing the solar cell to be obscured. Such TCC materials are also known to be used in various other opto-electronic applications, such as liquid crystal displays, CCD camera sensors and photocopiers, as well as a myriad of other opto-electronic type devices.

Various semiconductor coatings with a relatively wide band gap are known to be used for such TCC materials. Specifically, materials having a band gap greater than the energy of the photons of light passed therethrough are known to be used. For transparency across the entire visible/near-infrared (VNIR) band, materials with band gaps wider than 3 eV are known to be used.

In many known applications of such TCC materials, electrical conductivity for such TCC materials approaching that of metals is required. In order for the material to be electrically conductive, one or more of the electron energy bands of the material must be partially filled. In relatively high conductive materials, a partially filled electron energy band normally dominates the conduction.

The density of carriers in the electron energy band, n, required for a specific conductivity, is given by Equation(1).

$$n = \delta/q\mu, \qquad (1)$$

where q is the electronic charge, $\mu$ is the carrier mobility, and $\delta$ is the electrical conductivity.

To obtain a sufficient density of carriers in an electron energy band for the desired conductivity, the material is known to be doped because the Fermi level of the intrinsic (pure) material is normally deep within the band gap. However, doping is known to reduce the transmittance of the material for several reasons. First, the optical absorption of free carriers increases with the increasing concentration of carriers, as generally discussed in "Optical Processes in Semiconductors", by J. I. Pankove, *Dover Publications*, 1971, p.75. Second doping is known to change the density of states function, producing a tail on the absorption near the band edge, as generally discussed in "Absorption Edge of Impure Gallium Arsenide", by J. I. Pankove, *Physical Review A*, Vol. 140, 1965, pp. 2059–2065. The increase in absorption as a function of the doping level thus causes a fundamental trade-off in such TCC materials between electrical conductivity and VNIR transmittance.

Tin-doped indium oxide (ITO) is known to be used for such TCC material applications. As generally set forth in "Transparent Conductors—A Status Review", by K. L. Chopra, S. Major, and D. K. Pandya, *Thin Film Solids*, Vol. 102, 1983, pps. 1–46, such ITO coatings are known to have an electron mobility ranging from 15–40 $cm^2 NV$-s. In many known commercial and aerospace applications, transparent electrical conductors having a sheet electrical conductance of 1 or less ohms per square and a visible light transparency of 90% or better is required. A sheet electrical impedance of one ohm per square of the ITO coating requires a doping concentration of about $2 \times 10^{21}$ $cm^{-3}$. Unfortunately, such highly doped ITO coatings provide less than approximately 75% VNIR transmittance.

Such TCC's are known to be used in solar cell applications, for example, gallium arsenide (GaAs) solar cells. Such GaAs solar cells are normally include a TCC formed on a germanium substrate and are covered with a glass cover. Because of its superior electron mobility, gallium nitride GaN is known to be used for such TCCs. Unfortunately, when used in a GaAs solar cell application, the GaN is lattice mismatched at the solar cell interface. Such lattice mismatches are a major concern for GaAs solar cells since such mismatches are known to generate dislocations or defects that act as traps which decrease the minority carrier diffusion length resulting in a loss in the overall efficiency of the solar cell.

Another problem with such GaAs solar cells relates to the cost. In particular, many known GaAs solar cells are known to be formed on germanium substrates. However, such germanium substrates are relatively expensive, resulting in a relatively high manufacturing cost of the solar cells. Another problem with GaAs solar cells is the need for a separate cover glass which further drives up the cost. Thus there is a need for TCCs that are adapted to be used with GaAs solar cells which account for the lattice mismatches at the interface of the TCC. There is also a need to eliminate the expensive germanium substrate and the separate cover glass from GaAs solar cells in order to reduce costs.

SUMMARY OF THE INVENTION

Briefly, the present invention relates to a transparent conductive coating (TCC) formed from GaN on a sapphire substrate. In order to account for the lattice mismatch between the GaN and the sapphire substrate, a gallium nitride nucleation layer is formed on the sapphire substrate. A mask, for example, silicon dioxide $SiO_2$, is formed on top of the GaN nucleation layer with a plurality of openings. GaN is grown through the openings in the mask to form a lateral epitaxial overgrowth layer upon which defect-free GaN is grown. The lateral epitaxial overgrowth compensates for the lattice mismatch between the sapphire substrate and the GaN. The use of a sapphire substrate eliminates the need for a cover glass and also significantly reduces the cost of the TCC, since such sapphire substrates are about 1/7 the cost of germanium substrates. The TCC may then be disposed on a GaAs solar cell. In order to compensate for the lattice mismatches between the GaAs and the GaN, an indium gallium phosphate InGaP may be disposed between the GaAs solar cell and the GaN TCC to compensate for the lattice mismatch between the GaN and the GaAs. In order to further compensate for the lattice mismatch between the GaN and InGaP, the interface may be formed as a super lattice or as a graded layer. Alternatively, the interface between the GaN and the InGaP may be formed by the offset method or by wafer fusion. The TCC, in accordance with the present invention, is able to compensate for the lattice mismatches at the interfaces of the TCC while eliminating the need for a cover glass and a relatively expensive germanium substrate.

BRIEF DESCRIPTION OF THE DRAWING

These and other objects of the present invention will be readily understood with reference to the following specification and attached drawing, wherein.

DETAILED DESCRIPTION OF THE INVENTION

Figure 1:
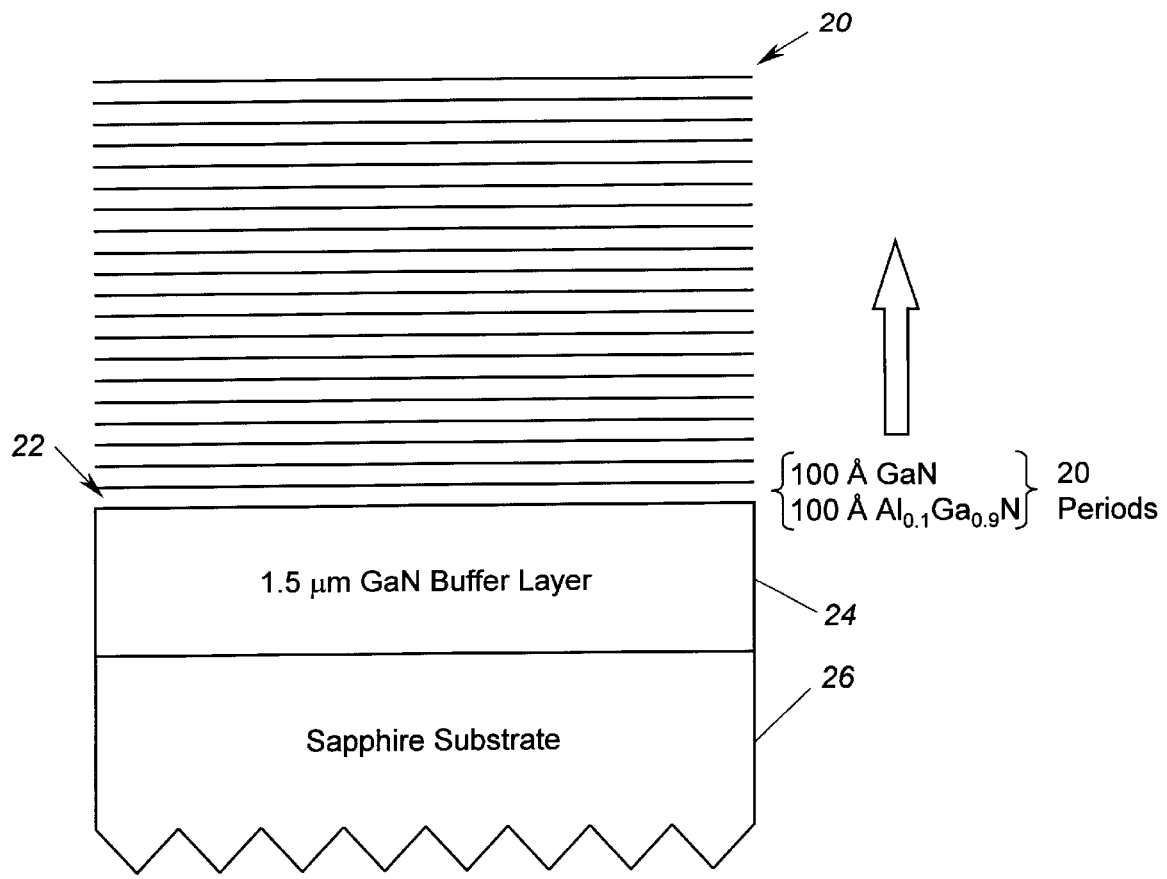
FIG. 1 is an exemplary elevational view of a transparent electrical conductor formed in accordance with the present invention, which includes twenty quantum wells formed at the interface of AlGaN and GaN, formed with a GaN buffer layer on a sapphire substrate.
Figure 2:
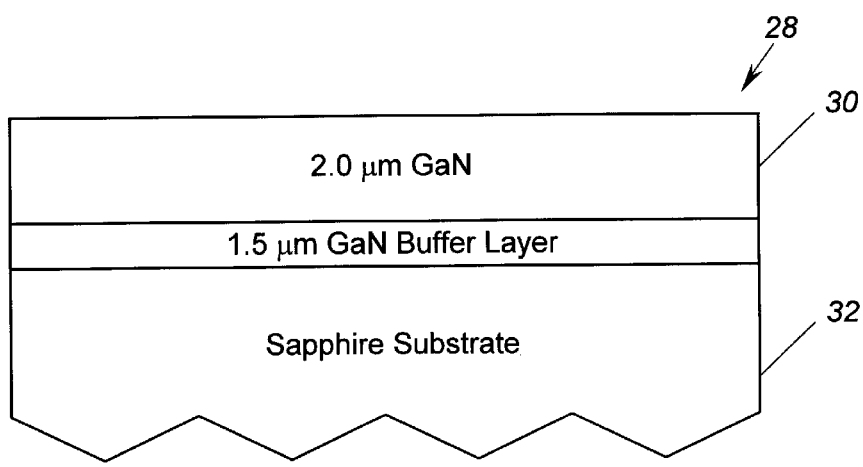
FIG. 2 is an elevational view of an alternate embodiment of the invention utilizing GaN formed on a sapphire substrate.
Figure 3A:
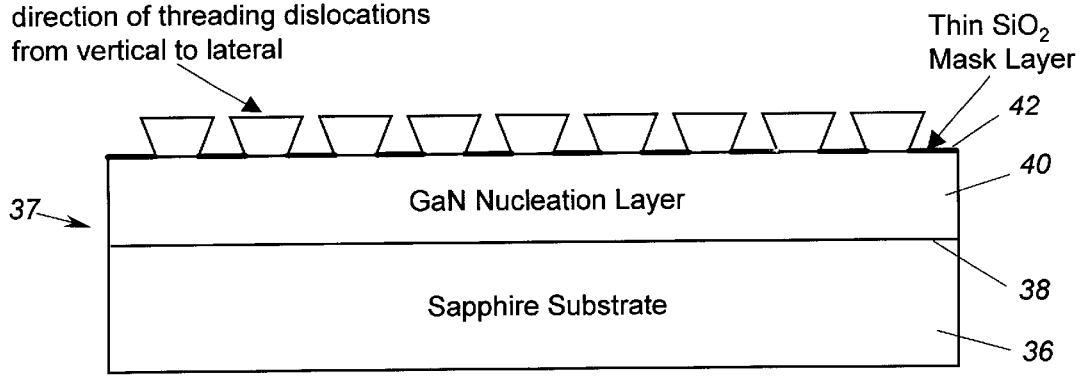
FIGS. 3A–3C are elevational views representing the process steps for making a transparent conductive coating (TCC) in accordance with an alternative embodiment of the invention utilizing GaN on a sapphire substrate.
Figure 3B:
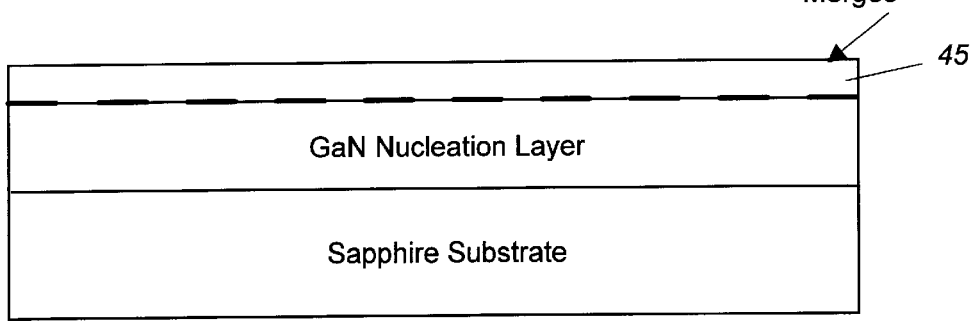
Figure 4A:
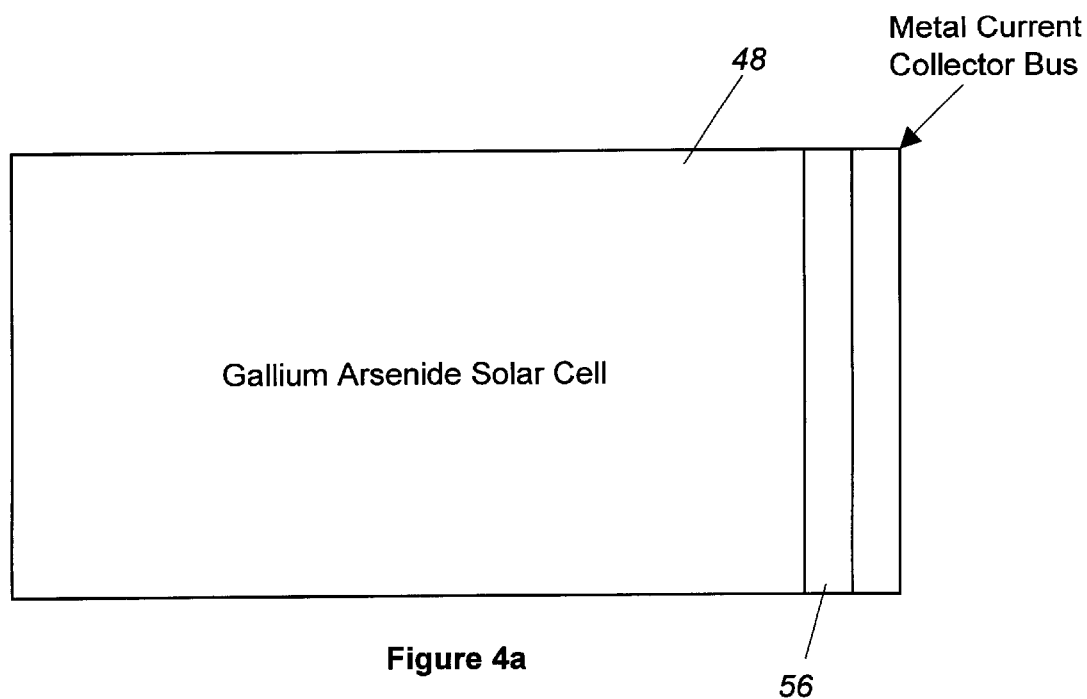
FIG. 4A is a plan view of an exemplary GaAs solar cell utilizing a GaN TCC in accordance with the present invention.
Figure 4B:
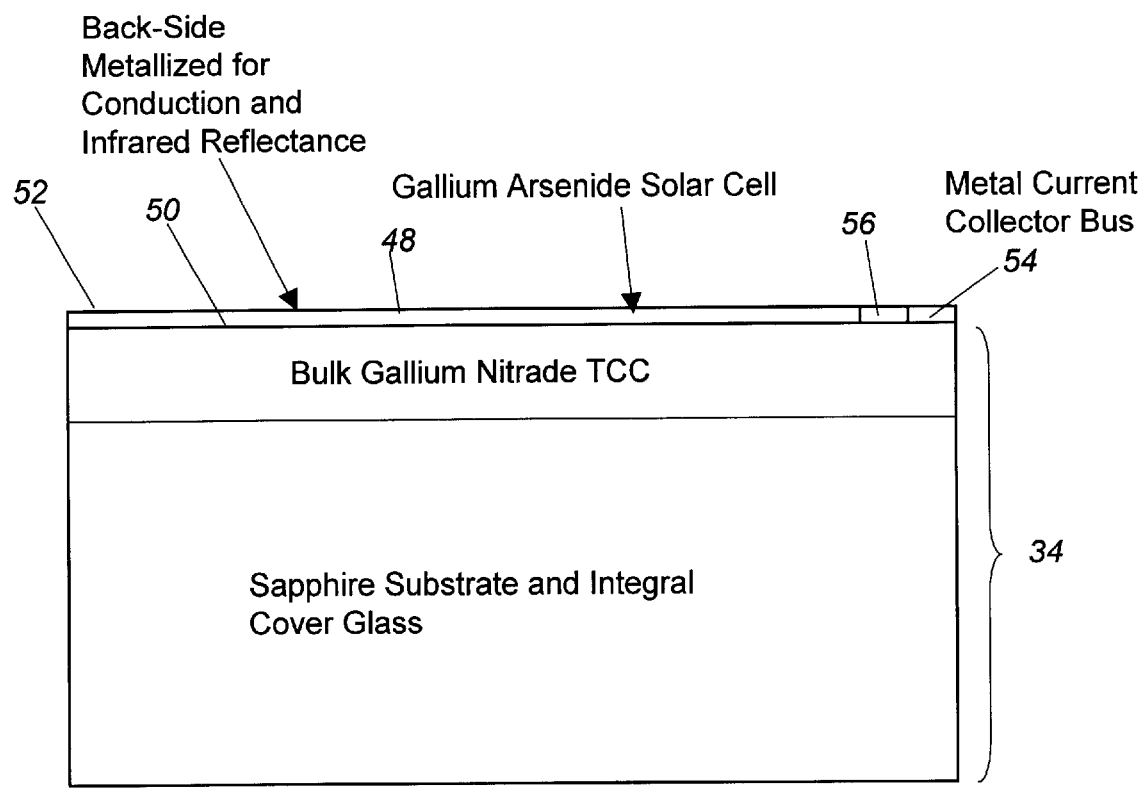
FIG. 4B is a cross-sectional view of the solar cell illustrated in FIG. 4A.

Three basic embodiments of a transparent conductive coating (TCC) are disclosed. All three embodiments utilize a sapphire substrate and are adapted to being utilized in various applications including solar cells. FIG. 1 illustrates an embodiment which utilizes a plurality of GaN—Al$_{(1-x)}$Ga$_{(x)}$N quantum wells. FIG. 2 illustrates an embodiment in which bulk gallium nitride GaN is formed on a buffer layer and a sapphire substrate. FIGS. 3A–3B illustrate an alternate embodiment of the bulk GaN TCC which includes a GaAs nucleation layer and GaAs lateral epitaxial overgrowth to compensate for lattice mismatches at the interface of the GaN and the sapphire substrate. In applications where the GaN TCC is used with GaAs solar cells, for example, as illustrated in FIGS. 4A and 4B, lattice mismatch compensation is also provided at the GaN and GaAs interface.

All of the embodiments provide relatively higher electrical conductivity with reduced optical losses than known transparent electrical conductors, such as tin-doped indium oxide (ITO). All of the embodiments utilize materials with a relatively wide band gap and a carrier mobility significantly larger than that of ITO, in order to reduce doping, while maintaining the desired electrical conductivity. As discussed above, the doping is required to achieve the desired electrical conductivity of the material. Unfortunately, such doping also results in optical losses, thus reducing the transmittance in the VNIR to unacceptable levels.

The first embodiment of the TCC is illustrated in FIG. 1. In this embodiment, the TCC is formed as a plurality of quantum wells formed at the interface of two lattice matched, wide band gap crystalline materials. The interface of the two lattice matched, wide band gap crystalline materials provide relatively higher electron mobility than the electron mobility in the same bulk materials for the same electron concentrations, as discussed in "Electron Mobility in Single and Multiple-Period Modulation-Doped (Al,Ga) As Heterostructures", by T. J. Drummond, et al., Journal of Applied Physics, Vol. 53, No. 2, February 1982, pps. 1023–1027; and "Observation Two-Dimensional Electron Gas in Low Pressure Metal Organic Chemical Vapor Deposited GaN—Al$_x$Ga$_{1-x}$N Heterojunction", by M. Asif Kahn, et al., Applied Physics Letters, Vol. 60, No. 24, Jun. 15, 1992, pps. 3027–3029. For materials such as AlGaN and GaN, such two-dimensional quantum well structures are known to have electron mobilities as high as 800 cm$^2$/V-s, while the electron mobility of a similarly doped (typically silicon is used for the dopant) bulk GaN is known to be only 300 cm$^2$/V-s. As set forth in "GaN, AlN, and InN: A Review", by S. Strite and H. Morkoc, Journal of Vacuum Science and Technology B, Vol. 10, No. 4, July-August 1992, pps. 1237–1266, both AlGaN and GaN have relatively wide band gaps of 6.2 eV and 3.4 eV, respectively. Moreover, as set forth in "The Preparation and Properties of Vapor Depositive Single Crystalline GaN", by H. P. Maruska and J. J. Tietjen, Applied Physics Letters, Vol. 15, No. 10, Nov. 15, 1969, pps. 327–329, both AlGaN and GaN have high optical transparency.

Referring to FIG. 1, the transparent electrical conductor in accordance with the first embodiment is formed from a plurality of quantum wells at the interface of two lattice-matched, wide band gap crystalline materials, for example, GaN and AlGaN. In this embodiment, the quantum wells 22 are formed by layers of GaN sandwiched between AlGaN barrier layers. Since the sheet resistance, R$_S$ of a plain sheet of materials equals $1/QN_A\mu$, where N$_A$ is the number of carriers per unit area, the sheet-charge density required for sheet resistance of one ohm/square would be 4×10$^4$, assuming a stack of 20 quantum wells, as generally illustrated in FIG. 1. Each quantum well, generally identified with the reference numeral 22, is formed at the interface of, for example, a 100 Å of GaN, and 100 Å of Al$_{0.1}$Ga$_{0.9}$N. These quantum wells 22 may be formed on a buffer layer 24, formed, for example, of 1.5 μm of GaN. The buffer layer 24 may be, in turn, formed on a transparent substrate 26, such as a sapphire substrate.

The electrically conductive coating 20 illustrated in FIG. 1 is relatively more complex than convention amorphous TCCs. The complexity can be substantially eliminated by forming a transparent electrical conductor 28, as shown in FIG. 2, from a bulk crystalline material, such as GaN, which, as mentioned above, has an electron mobility of 300 cm$^2$/V-s—about ten times higher than the electron mobility of ITO. The alternate embodiment of the transparent electrical conductor 28 is formed from a single n-type doped layer of a crystalline material, such as GaN, about 2 microns thick, on a transparent substrate 32, such as a sapphire substrate.

The transparent electrical conductor 28, illustrated in FIG. 2, outperforms known transparent electrical conductors, such as ITO. In particular, since the mobility of bulk GaN is about 10 times greater than that of ITO, an equal thickness of GaN will have an equal sheet resistance with one-tenth the carrier concentration. Since the sheet resistance, R$_s$, of a layer of GaN, having a thickness of δ and an electron concentration of n per unit volume equals 1/μNδ, 2 microns of GaN will require an n-type doping level of about $10^{20}$ for a sheet resistance of about 1 ohm/square. At such a doping level, contribution to the absorption coefficient from the free-carrier absorption is about 25× less than that for ITO, with the same sheet resistance. Since the absorption depends exponentially on the absorption coefficient, the free carrier absorption is substantially negligible for the structure illustrated in FIG. 2.

The classical formula for free carrier absorption is provided in Equation (2) below:

$$\alpha = nq^2\lambda^2/8\pi^2 Nmc^3\tau, \qquad (2)$$

where $\lambda$ represents a wavelength;

N represents a refractive index;

m represents the electrons effective mass in the conduction band;

c represents the speed of light in a vacuum;

$\tau$ represents the relaxation time for scattering of electrons; and $\alpha$ equals the absorption coefficient.

As set forth in "Solid State Electronic Devices", Second Edition, by B. G. Streetman, Prentice-Hall, 1980, p. 83, the carrier mobility $\mu$ may be formulated in accordance with Equation 3, as follows:

$$\mu = q\tau/m \qquad (3)$$

Substituting Equation 3 into Equation 2 yields Equation 4 as set forth below:

$$\alpha = nq^3\lambda^2/8\pi^2 Nm^2c^3\mu \qquad (4)$$

Since m is roughly half as large for a crystalline material, such as GaN, as for ITO, n is 10× smaller for GaN, $\mu$ is 10× larger for GaN, while the other parameters are either identical or similar for both materials. The absorption coefficient a is about 25× smaller for GaN. The absorption by free carriers (i.e., transitions in which carriers in the partially filled band go to higher energy states in the same band) is ordinarily the dominant absorption mechanism in the IR(NIR) for conductive wide band gap materials, whereas the tail of the band edge absorption is dominant at visible wavelengths. The NIR band edge absorption for the GaN layer, as illustrated in FIG. 2, is about 10 percent for wavelengths to 400 nm based on the optical absorption measurements on a similarly doped GaN. Thus, over the visible range, 10 percent is the maximum absorption for GaN.

The transparent electrical conductors 20 and 28 may be formed on transparent substrates 26 and 32, such as sapphire, respectively. Other materials are also contemplated for the substrates 26 and 32, such as ZnO and GaN. A GaN substrate provides optimal matching of the lattice and the thermal expansion coefficient.

Figure 3C:
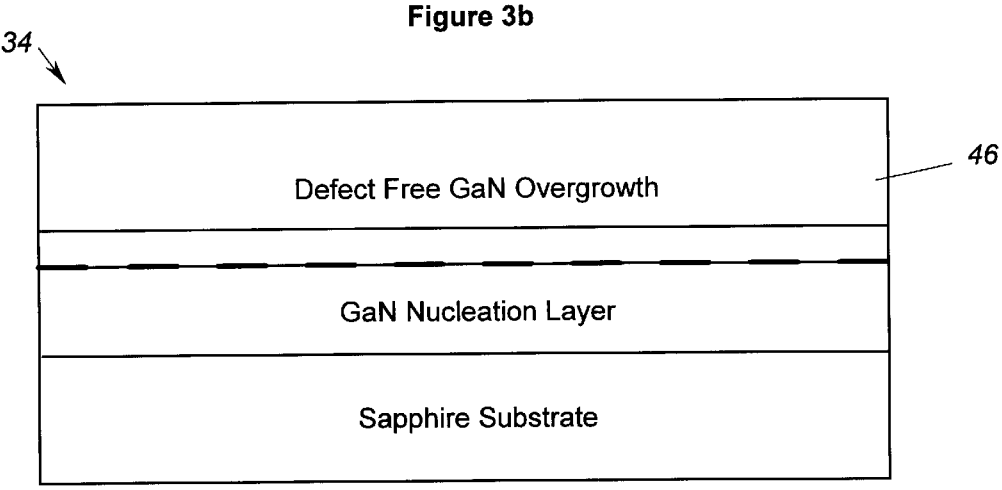

The third embodiment of the TCC in accordance with the present invention illustrated in FIGS. 3A–3C and generally identified with the reference numeral 34. The TCC 34 is formed on a sapphire substrate 36. In order to minimize defects resulting from the lattice mismatch between the sapphire substrate 36 and the GaN, a nucleation layer, generally identified with the reference numeral 37, is formed on top of the substrate 36. In addition to minimizing defects at the sapphire substrate 36 interface, the nucleation layer 37 improves the morphology of the GaN grown onto it. The nucleation layer 37 may be formed from an aluminum nitride (AlN) coating 38 in direct contact with the sapphire substrate 36 having a thickness, typically 1.5 microns, forming an interface. A seed layer 40 of GaN is grown on top of the AlN coating 38 forming the GaN nucleation layer 37. The nucleation layer 37 may be 500 angstroms thick or less depending on the temperature used for growing the GaN.

In order to compensate for the lattice mismatch between the sapphire substrate 36 and the GaN, additional GaN is grown on toop of the nucleation layer 37 by a process known as lateral epitaxial overgrowth. Threading dislocations associated with the lattice mismatch between the GaN and the sapphire substrate 36 are reduced not only from the mask blocking of the dislocations but also by a change in the propagation direction of the dislocations at the lateral epitaxial overgrowth growth front. In particular, the dislocations propagate laterally but are prevented from growing up into subsequent growth layers to produce virtually defect-free layers of gallium nitride.

With reference to FIGS. 3A–3C, a mask layer 42, for example, 200 nanometers of the silicon dioxide $SiO_2$, is epitaxially grown over the GaN with openings, generally identified with the reference numeral 44, of about 5 microns. As the GaN growth is resumed, the GaN grows out of the mask openings. As best shown in FIG. 3A, the direction of the threading dislocations in the nucleation layer 40 are generally vertical. As the GaN grows through the openings 44 in the mask layer 42, the direction of the threading dislocations changes from vertical to lateral. As shown in FIG. 3B, these dislocations grow laterally and merge with the overgrowth from adjacent openings to form a lateral overgrowth layer 44. The dislocations are prevented from growing up into subsequent growth layers to enable a defect-free GaN overgrowth layer 46 to be formed thereupon that is virtually defect free, to form a transparent conductive coating on a sapphire substrate 36 that is virtually free of defects thus compensating for the lattice dislocations at the sapphire substrate interface. The TCC, in accordance with the present invention, not only provides improved performance relative to other known TCCs as discussed above but also reduces the manufacturing costs by eliminating the need for a cover glass and also eliminating the need for a germanium substrate. As mentioned above, such germanium substrates are known to cost about seven times the cost of a sapphire substrate.

The TCC 34, illustrated in FIGS. 3A–3C, is amenable to being used in applications of solar cells, for example, GaAs solar cells. Referring to FIGS. 4A and 4B, a GaAs solar cell is generally identified with the reference numeral 48. Such GaAs solar cells 48 are generally known in the art. Referring to FIGS. 4A and 4B, the GaAs solar cell 48 may be formed on top of the GaN TCC 34. Since the GaN TCC is formed on a sapphire substrate, the need for separate cover glass is eliminated. In addition, as best illustrated in FIG. 4B, the GaAs solar cell 48 may be formed directly on top of the GaN TCC 34, thus eliminating the need for a separate substrate for the GaAs solar cell 48. In order to minimize the lattice mismatch between the GaN TCC 34 and the GaAs solar cell 48, a layer indium gallium phosphide InGaP 50 may be deposited at the interface between the GaN TCC 34 and the GaAs solar cell 48.

A metallization layer 52 may be formed on top of the GaAs solar cell 48. The metallization layer 52, formed by conventional techniques, may be used for infrared reflectance as well as electrical conductance, for example, for electrically connecting the solar cell 48 to another solar cell. A metal current collector bus 54 may be formed on one end of the device by conventional masking and deposition techniques. The metal current collector bus 54 is electrically isolated from the GaAs solar cell 48 by a dielectric 56, for example, SiO$_2$ or Al$_2$O$_3$, formed by conventional masking and deposition techniques. Electrical current from the GaAs solar cell 48 is collected by the GaN TCC 34, which acts as a front collector which to direct the electron flow from the TCC 34 to the metal current collector bus 54.

In order to further compensate for the lattice mismatch between the GaN TCC 34 and the GaAs solar cell 48, additional techniques may be used. In particular, a super lattice may be formed at the interface between the GaAs solar cell 48 and the gallium nitride GaN TCC 34. The super lattice can be formed using thin alternating layers of the two semiconductor materials to be mated. In this case, the alternating layers are formed from GaN and InGaP. The super lattices may be formed on the order of 10–100 angstroms thick. The super lattice reduces the strain between the layers which, in turn, reduces the number of dislocations or defects. Examples of super lattices are discussed in detail in "AlN/GaN Superlattices Grown by Gas Source Molecular Beam Epitaxy", by Z. Sitar, M. J. Paisley, B. Yan and R. F. Davis, hereby incorporated by reference.

The lattice mismatch between the GaN TCC 34 and the GaAs solar cell 48 can also be compensated by way of a graded layer. The graded layer is formed from two mating materials that are blended together by changing the constituent atoms of one material for that of the other material. In this case, indium In and phosphorous P are incrementally added while eliminating nitrogen to produce a graded layer, for example from 10 to 100 angstroms thick. With this approach, the mismatch strain is taken up by the graded layer and results in a reduction in a number of defects or dislocation in the indium gallium phosphide InGaP layer 50. An example of this technique is disclosed in the reference described above.

Alternately an offset method may be used to compensate for the lattice mismatch between the GaN TCC 34 and the GaAs solar cell 48. In this embodiment, a GaN crystal plane is selected that is offset from a major crystal plane of the GaN so that distance between the atoms on a substrate surface approximates the distance between the atoms in the InGaP layer 50 deposited onto it. Such an arrangement leads to a deflection of the dislocations so that they are primarily confined to the interface between the GaN TCC 34 and the InGaP and not propagated into the InGaP. This technique allows the direct overgrowth of InGaP onto the GaN and therefore no thickness is associated with this method. An example of this method is disclosed.

A wafer fusion technique may also be used to overcome the lattice mismatch between the (GaN) TCC 34 and GaAs solar cell 48. In this technique, the GaN and InGaP are joined under pressure and temperature to create a defect-free interface. Since this technique relates to direct mating there is no thickness associated with this interface.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A transparent conductive coating (TCC) comprising:
   a sapphire substrate;
   a nucleation layer formed on said sapphire substrate;
   a lateral epitaxial overgrowth layer of gallium nitride GaN formed on top of said nucleation layer; and
   a defect-free gallium nitride GaN layer formed on top of said lateral epitaxial overgrowth layer.

2. The TCC as recited in claim 1, wherein said nucleation layer includes an aluminum nitride (AlN) coating and a gallium nitride (GaN) seed layer.

3. The TCC as recited in claim 2, wherein a mask is formed on top of said nucleation layer with a plurality of openings.

4. The TCC as recited in claim 3, wherein said mask is formed from silicon dioxide (SiO$_2$).

5. The TCC as recited in claim 1, wherein an interface is formed on top of said defect-free gallium nitride (GaN) layer.

6. The TCC as recited in claim 5, wherein said interface is disposed between a gallium arsenide GaAs layer and said defect-free gallium nitride GaN layer.

7. The TCC as recited in claim 5, wherein said interface includes a layer of indium gallium phosphide InGaP.

8. The TCC as recited in claim 5, wherein said interface is formed with alternating layers of gallium nitride GaN and indium gallium phosphide InGaP forming a superlattice.

9. The TCC as recited in claim 5, wherein said interface is formed as a graded layer.

10. The TCC as recited in claim 1, wherein said defect-free gallium arsenide GaN layer has a plurality of crystal planes including a major crystal plane and a crystal plane is selected that is offset from the major crystal plane.

* * * * *